United States Patent
Rouviere et al.

(10) Patent No.: US 9,793,257 B1
(45) Date of Patent: Oct. 17, 2017

(54) ELECTROSTATIC DISCHARGE PROTECTION DEVICE HAVING AN ADJUSTABLE TRIGGERING THRESHOLD

(71) Applicant: STMicroelectronics (Tours) SAS, Tours (FR)

(72) Inventors: Mathieu Rouviere, Tours (FR); Arnaud Florence, Saint Antoine du Rocher (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 15/252,964

(22) Filed: Aug. 31, 2016

(30) Foreign Application Priority Data

Mar. 30, 2016 (FR) ...................... 16 52712

(51) Int. Cl.
*H01L 27/02* (2006.01)
*H01L 27/06* (2006.01)
*H01L 29/866* (2006.01)
*H01L 49/02* (2006.01)
*H01L 23/31* (2006.01)

(52) U.S. Cl.
CPC ...... *H01L 27/0248* (2013.01); *H01L 23/3114* (2013.01); *H01L 27/0676* (2013.01); *H01L 28/40* (2013.01); *H01L 29/866* (2013.01)

(58) Field of Classification Search
None
See application file for complete search history.

(56) References Cited

U.S. PATENT DOCUMENTS

| 2002/0180552 A1* | 12/2002 | Bennett | H03G 11/02 333/17.2 |
| 2011/0089540 A1 | 4/2011 | Drost et al. | |
| 2014/0036399 A1* | 2/2014 | Ory | H01L 23/62 361/56 |

OTHER PUBLICATIONS

INPI Search Report and Written Opinion for FR 1652712 dated Nov. 30, 2016 (7 pages).

* cited by examiner

*Primary Examiner* — Angel Roman
*Assistant Examiner* — Kevin Quinto
(74) *Attorney, Agent, or Firm* — Gardere Wynne Sewell LLP

(57) ABSTRACT

An electrostatic discharge protection device includes first and second diodes series-connected between first and second connection terminals. A third connection terminal is coupled to a junction of the first and second diodes. A capacitor is connected in parallel with the first and second diodes between the first and second terminals.

11 Claims, 1 Drawing Sheet

ELECTROSTATIC DISCHARGE PROTECTION DEVICE HAVING AN ADJUSTABLE TRIGGERING THRESHOLD

PRIORITY CLAIM

This application claims the priority benefit of French Application for Patent No. 1652712, filed Mar. 30, 2016, the disclosure of which is hereby incorporated by reference in its entirety to the maximum extent allowable by law.

TECHNICAL FIELD

The present disclosure relates to devices for protecting electronic components, and particularly integrated circuits, against electrostatic discharges.

BACKGROUND

FIG. 1 schematically illustrates an electronic device comprising an integrated circuit 100, and a device 110 for protecting integrated circuit 100 against electrostatic discharges.

Integrated circuit 100 comprises terminals of connection to external devices. More particularly, in the shown example, integrated circuit 100 comprises a terminal 101 of application of a high power supply potential VDD of the circuit, a terminal 102 of application of a low power supply potential or reference potential GND of the circuit, and an input/output terminal 103 (IO) of the circuit, capable of supplying and/or of receiving data signals.

Protection device 110 is coupled to connection terminals 101, 102, and 103 of integrated circuit 100. The function of protection device 110 is to enable, when an electrostatic discharge occurs on one of the connection terminals of integrated circuit 100, a fast removal of the discharge, to avoid for the latter to damage circuit 100.

Protection device 110 of FIG. 1 comprises two diodes 111 and 112, series-connected between power supply terminals 102 and 101 of integrated circuit 100. The junction of diodes 111 and 112 is coupled to input/output terminal 103 of circuit 100. More particularly, in this example, diode 111 has its anode connected to low power supply terminal 102 and has its cathode connected to input/output terminal 103, and diode 112 has its anode connected to input/output terminal 103 and its cathode connected to high power supply terminal 101. Protection device 110 further comprises a Zener diode 113 connected in parallel with diodes 111 and 112, between the low and high power supply terminals 102 and 101 of circuit 100. Zener diode 113 has its anode connected to terminal 102 and its cathode connected to terminal 101.

Protection device 110 operates as follows. When a overvoltage which is positive with respect to the reference potential or ground potential GND occurs on terminal 103 of integrated circuit 100, this overvoltage is removed via diode 112, which is then forward-conductive, and via Zener diode 113, which then conducts in avalanche. When an overvoltage which is negative with respect to reference potential GND occurs on terminal 103 of circuit 100, this overvoltage is removed via diode 111, which is then forward-conductive. When an overvoltage which is positive with respect to reference potential GND occurs on terminal 101 of circuit 100, this overvoltage is removed via Zener diode 113, which then conducts in avalanche. When an overvoltage which is negative with respect to reference potential GND occurs on terminal 101 of circuit 100, this overvoltage is removed via Zener diode 113, which is then forward-conductive.

For positive overvoltages, the threshold for triggering the protection is set by the avalanche threshold of Zener diode 113. The triggering threshold should be selected to be greater than power supply voltage VDD of integrated circuit 100, and greater than the maximum voltage level of the data signals capable of transiting on input/output terminal 103 of circuit 100, but smaller than the maximum overvoltage level capable of being withstood by circuit 100 with no degradation.

In recent integrated circuit manufacturing processes, the window within which the protection device triggering threshold should be selected is relatively limited, which poses problems on the design of the electronic systems. In particular, for each component to be protected, a specific protection device should be selected, by taking into account the levels of the nominal operating voltages of the component, and the maximum overvoltage level that the component can withstand.

To ease the design of electronic systems and decrease costs, it would be desirable to have an electrostatic discharge protection device with an adjustable triggering threshold, to be able to use a same protection device in systems having different nominal operating voltages.

SUMMARY

An embodiment provides an electrostatic discharge protection device, comprising: first and second diodes series-connected between first and second connection terminals of the device; a third connection terminal coupled to the junction of the first and second diodes; and a capacitor connected in parallel with the first and second diodes, between the first and second terminals.

According to an embodiment, the first diode is forward-connected between the second and third terminals, and the second diode is forward-connected between the third and first terminals.

According to an embodiment, the capacitor has a first electrode connected to the first terminal and a second electrode connected to the second terminal.

According to an embodiment, the device comprises a package for encapsulating the first and second diodes and the capacitor, the package exposing the first, second, and third connection terminals of the device.

Another embodiment provides a system comprising an integrated circuit and a protection device such as defined hereabove.

According to an embodiment, the integrated circuit comprises a first terminal of application of a power supply potential, a second terminal of application of a reference potential, and a third input/output terminal, the second and third terminals of the protection device being respectively coupled to the second and third terminals of the integrated circuit, and the first terminal of the protection device being coupled to a terminal of application of a DC bias potential.

According to an embodiment, the first terminal of the protection device is coupled to the first terminal of the integrated circuit.

According to an embodiment, the first terminal of the protection device is coupled to a terminal of application of a DC bias potential different from the power supply potential.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
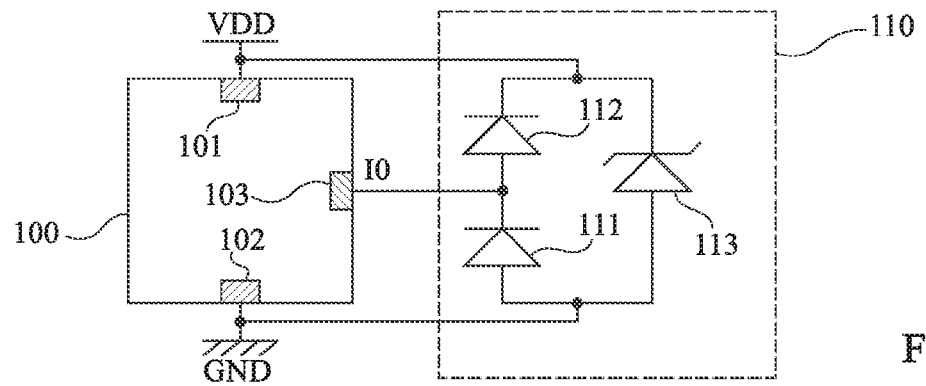
FIG. 1, previously-described, schematically illustrates an electronic system comprising an integrated circuit and an example of an integrated circuit protection device.

The same elements have been designated with the same reference numerals in the different drawings. For clarity, only those elements which are useful to the understanding of the described embodiments have been shown and are detailed. In the present description, term "connected" is used to designate a direct electric connection, with no intermediate electronic component, for example, by means of one or a plurality of conductive tracks or conductive wires, and term "coupled" or term "linked" is used to designate either an electric connection which may be direct (then meaning "connected") or indirect (that is, via one or a plurality of intermediate components). Unless otherwise specified, expressions "approximately", "substantially", and "in the order of" mean to within 10%, preferably to within 5%.

Figure 2:
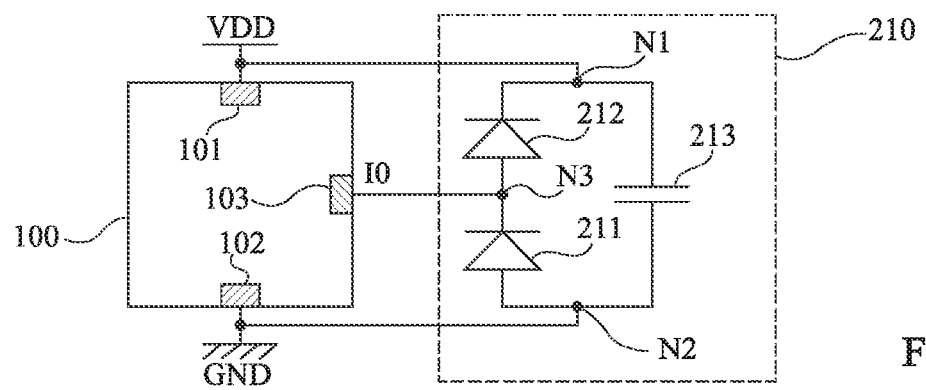
FIG. 2 schematically illustrates an electronic system comprising an integrated circuit and an example of an integrated circuit protection device according to an embodiment.

FIG. 2 schematically illustrates an electronic system comprising an integrated circuit 100, for example, identical or similar to circuit 100 of FIG. 1, and an embodiment of a device 210 of protection of integrated circuit 100 against electrostatic discharges.

Protection device 210 of FIG. 2 comprises two diodes 211 and 212 series-connected between connection terminals N1 and N2 of device 210. Terminals N1 and N2 of the device are respectively coupled to the high power supply terminal 101 and to the low power supply terminal 102 of circuit 100. The series connection junction of diodes 211 and 212 is coupled to a connection terminal N3 of device 210, coupled to input/output terminal 103 of circuit 100. More particularly, in the shown example, diode 211 has its anode connected to terminal N2 and its cathode connected to terminal N3, and diode 212 has its anode connected to terminal N3 and its cathode connected to terminal N1. Protection device 210 further comprises a capacitor 213 connected in parallel with diodes 211 and 212, between connection terminals N1 and N2 of device 210. In the shown example, the electrodes of capacitor 213 are respectively connected to terminal N1 and to terminal N2.

Protection device 210 operates as follows. When the integrated circuit 100 is being powered and there is no overvoltage, capacitor 210 of the protection device charges to a voltage substantially equal to power supply voltage VDD of circuit 100. When an overvoltage which is positive with respect to the reference potential or ground potential GND occurs on terminal 103 of integrated circuit 100, this overvoltage is removed via diode 212, which then is forward-conductive, and capacitor 213, which is conductive for transient signals. When an overvoltage which is negative with respect to reference potential GND occurs on terminal 103 of circuit 100, this overvoltage is removed via diode 211, which is then forward-conductive. When an overvoltage which is positive with respect to reference potential GND occurs on terminal 101 of circuit 100, this overvoltage is removed via capacitor 213, which is conductive for transient signals. When an overvoltage which is negative with respect to reference potential GND occurs on terminal 101 of circuit 100, this overvoltage is removed via diodes 211 and 212, which are then forward-conductive.

Thus, in the embodiment of FIG. 2, for positive overvoltages, the triggering threshold of the protection is set by the DC voltage level across capacitor 213, that is, by the DC bias potential applied to terminal N1 of the protection device, that is, high power supply potential VDD of integrated circuit 100 in the example of FIG. 2.

An advantage of the configuration of FIG. 2 is that the triggering threshold of protection device 210 automatically adapts to the level of power supply voltage VDD of integrated circuit 100 to be protected. Thus, identical protection devices 210 may be used in systems powered at different voltage levels.

In practice, integrated circuit 100 may comprise a plurality of different input/output terminals (I/O) to be protected. Protection device 210 of FIG. 2 may then be replicated as many times as circuit 100 comprises input/output terminals to be protected, terminals N1 and N2 of the different devices 210 being respectively connected to power supply terminals 101 and 102 of circuit 100, each input/output terminal to be protected of circuit 100 being connected to terminal N3 of one of protection devices 210. As a variation, rather than replicating capacitor 213 as many times as circuit 100 comprises input/output terminals to be protected, a same capacitor 213 may be shared by a plurality of input/output terminals of the protection device. In other words, the protection device may comprise a plurality of pairs of diodes 211, 212 series-connected between terminals N1 and N2, the junction of each pair of diodes being intended to be connected to one of the input/output terminals of the circuit to be protected, and a single capacitor 213 shared by said pairs of diodes, connected between terminals N1 and N2.

Diodes 211 and 212 and capacitor 213 of protection device 210 are preferably components external to integrated circuit 100. This enables to position protection 210 at closest to the impact of the transient signal independently from the position of circuit 100 to be protected in the system. To be able to withstand high electrostatic discharges, diodes 211 and 212 and capacitor 213 preferably have low series resistances, and thus have relatively large surface areas. As an example, the equivalent dynamic series resistance of the protection device is in the range from 10 to 100 mΩ, for example, in the order of 50 mΩ. Diodes 211 and 212 are for example capable of withstanding with no degradation currents up to 16 A for an 8-kV IEC 61000-4-2 transient wave. For IEC 61000-4-2 transient overvoltages, capacitor 213 should be able to withstand a voltage equivalent to the discharge of the capacitance of the network (in the order of 150 pF) of the transient wave. As an example, capacitor 213 has a capacitance in the range from 0.5 to 5 μF, for example, in the order of 1 μF, which corresponds to a voltage across capacitor 213 in the order of 1.2 V. For a 5-μF capacitance, the voltage across capacitor 213 falls to approximately 0.24 V. The residual voltage for a residual overvoltage on the input of the circuit to be protected then is in the order of VDD+ the voltage drop of diode 212 in the on state+ the voltage across capacitor 213, that is, approximately 1.2 V for a 1-μF capacitance. Relatively low residual voltages can thus be obtained with a capacitor having a capacitance in the range from 0.5 to 5 μF. Diodes 211 and 212 and capacitor 213 are for example arranged in a same encapsulation package of protection device 210, which package does not include circuit 100 to be protected and exposes connection terminals N1, N2, and N3 of protection device 210. Diode 211 and 212 and capacitor 213 may be monolithically integrated in a same integrated circuit chip. As a variation, diodes 211 and 212 and capacitor 213 may be discrete components integrated in a same package to form a SiP-type protection device ("System In Package").

Figure 3:
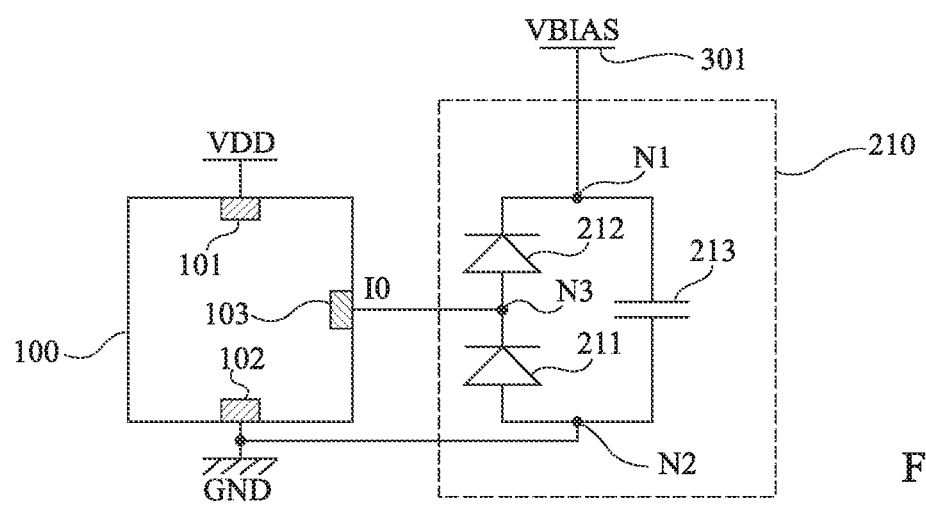
FIG. 3 schematically illustrates an electronic system comprising an integrated circuit and another example of an integrated circuit protection device according to an embodiment.

FIG. 3 schematically illustrates another example of an electronic system comprising an integrated circuit 100, for example, identical or similar to circuit 100 of FIGS. 1 and 2, and a device 210 for protecting integrated circuit 100 against electrostatic discharges.

Protection device 210 of the system of FIG. 3 is for example identical to protection device 210 of the system of FIG. 2.

The system of FIG. 3 differs from the system of FIG. 2 in that, in the system of FIG. 3, connection terminal N1 of protection device 210 is not connected to high power supply terminal 101 of circuit 100 to be protected, but rather to a terminal or node 301 of application of a DC bias potential VBIAS, different from high power supply potential VDD of the circuit to be protected. Bias potential VBIAS, which is positive with respect to reference potential GND, may be supplied by integrated circuit 100 to be protected, or by an external bias circuit (not shown) of the system.

An advantage of the configuration of FIG. 3 is that the threshold for triggering the protection may be set to a level independent from power supply voltage VDD of integrated circuit 100 to be protected, for example, to a level lower or higher than power supply voltage VDD.

It should be noted that in the configuration of FIG. 3, protection device 210 enables to remove positive or negative overvoltages occurring on input/output terminal 103 of circuit 100, but does not enable to remove overvoltages occurring on high power supply terminal 101 of circuit 100. Other protection components, not shown, may be provided to address electrostatic discharges likely to occur on terminal 101.

Specific embodiments have been described. Various alterations, modifications, and improvements will occur to those skilled in the art. In particular, the described embodiments are not limited to the examples of numerical values mentioned in the present description. It should further be noted that the electronic systems described in relation with FIGS. 2 and 3 may comprise additional protection components integrated to circuit 100, not detailed in the drawings, which complete the protection provided by device 210. In particular, integrated circuit 100 may comprise, for each input/output terminal of the circuit, in addition to diodes 211 and 212 of protection device 210, two integrated protection diodes, series-connected between low power supply terminal 102 and high power supply terminal 101 of the circuit, the junction of the two diodes being coupled to the input/output terminal to be protected of circuit 100.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A device for protecting a circuit against electrostatic discharges, comprising:
   first and second diodes series-connected between first and second connection terminals;
   a third connection terminal coupled to a junction between the first and second diodes and connected to an input/output node of said circuit; and
   a capacitor connected in parallel with the first and second diodes and between the first and second terminals; and
   wherein said second connection terminal is connected to a ground node of said circuit and wherein said first connection terminal is coupled to receive a bias voltage different from a voltage at the input/output node, ground node or supply voltage node of said circuit.

2. The device of claim 1, wherein the first diode is forward-connected between the second and third terminals, and the second diode is forward-connected between the third and first terminals.

3. The device of claim 1, wherein the capacitor has a first electrode connected to the first terminal and a second electrode connected to the second terminal.

4. The device of claim 1, comprising a package for encapsulating the first and second diodes and the capacitor, this package exposing the first, second and third connection terminals.

5. A system, comprising:
   an integrated circuit having a high power supply terminal, a signal terminal and a low power supply terminal; and
   a device for protecting the integrated circuit comprising:
      first and second diodes series-connected between a bias node and the low power supply terminal;
      a junction between the first and second diodes connected to the signal terminal; and
      a capacitor connected in parallel with the first and second diodes and between the bias node and the low power supply terminal; and
      wherein the bias node is coupled to receive bias voltage different from a voltage at any of the high power supply terminal, signal terminal or low power supply terminal of said integrated circuit.

6. A system, comprising:
   an integrated circuit having a high power supply terminal, a signal terminal and a low power supply terminal, the high and low power supply terminals receiving circuit power supply voltages;
   a device for protecting the integrated circuit consisting of:
      first and second diodes series-connected between a bias terminal and the low power supply terminal, said bias terminal different from the high power supply terminal, the signal terminal and the low power supply terminal;
      a junction between the first and second diodes connected to the signal terminal; and
      a capacitor connected in parallel with the series-connected first and second diodes and between the bias terminal and the low power supply terminal; and
   a bias supply configured to apply a bias voltage to said bias terminal that is different from the circuit power supply voltages.

7. The device of claim 6, wherein the first diode is forward-connected between the low power supply terminal and the signal terminal, and the second diode is forward-connected between the signal terminal and the bias terminal.

8. The device of claim 6, wherein the capacitor has a first electrode connected to the bias supply terminal and a second electrode connected to the low power supply terminal.

9. The device of claim 6, comprising a package for encapsulating the first and second diodes and the capacitor, this package exposing the bias supply terminal, the signal terminals and the low power supply terminal.

10. A system, comprising:
    an integrated circuit having a high power supply terminal, a signal terminal and a low power supply terminal; and
    a device for protecting the integrated circuit comprising:
       a first diode directly connected between the signal terminal and the low power supply terminal;

a second diode directly connected between a bias terminal and the signal terminal, said bias terminal being different from the high power supply terminal, the signal terminal and the low power supply terminal;

a capacitor directly connected between the bias terminal and the low power supply terminal; and a bias supply configured to apply a bias voltage to said bias terminal, said bias voltage being different from a voltage at the high power supply terminal, the signal terminal and the low power supply terminal.

11. A system, comprising:

an integrated circuit having a high power supply terminal, a signal terminal and a low power supply terminal; and a device for protecting the integrated circuit against an electrostatic discharge (ESD), said device comprising:

a first ESD diode connected between the signal terminal and the low power supply terminal;

a second ESD diode connected between a bias terminal and the signal terminal, said bias terminal being different from the high power supply terminal, the signal terminal and the low power supply terminal;

a capacitor connected between the bias terminal and the low power supply terminal; and a bias supply configured to apply a bias voltage to said bias terminal, said bias voltage being different from a voltage at the high power supply terminal, the signal terminal and the low power supply terminal.

* * * * *

UNITED STATES PATENT AND TRADEMARK OFFICE
CERTIFICATE OF CORRECTION

PATENT NO. : 9,793,257 B1
APPLICATION NO. : 15/252964
DATED : October 10, 2017
INVENTOR(S) : Mathieu Rouviere et al.

Page 1 of 1

It is certified that error appears in the above-identified patent and that said Letters Patent is hereby corrected as shown below:

In the Specification

At Column 1, Line number 30, please replace the term [[103 (10)]] with -- 103 (IO) --.

Signed and Sealed this
Fifth Day of December, 2017

Joseph Matal
*Performing the Functions and Duties of the*
*Under Secretary of Commerce for Intellectual Property and*
*Director of the United States Patent and Trademark Office*